United States Patent
Yu et al.

(10) Patent No.: US 12,456,709 B2
(45) Date of Patent: Oct. 28, 2025

(54) STRUCTURES AND PROCESSES FOR VOID-FREE HYBRID BONDING

(71) Applicant: International Business Machines Corporation, Armonk, NY (US)

(72) Inventors: Roy R. Yu, Poughkeepsie, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 18/089,732

(22) Filed: Dec. 28, 2022

(65) Prior Publication Data
US 2024/0222313 A1    Jul. 4, 2024

(51) Int. Cl.
  *H01L 23/00* (2006.01)
  *H01L 21/683* (2006.01)
  *H01L 21/78* (2006.01)

(52) U.S. Cl.
  CPC .......... *H01L 24/80* (2013.01); *H01L 21/6838* (2013.01); *H01L 21/78* (2013.01);
  (Continued)

(58) Field of Classification Search
  CPC ................ H01L 21/6838; H01L 21/78; H01L 2224/80011; H01L 2224/80013;
  (Continued)

(56) References Cited

U.S. PATENT DOCUMENTS

| | | | |
|---|---|---|---|
| 8,703,583 B2 | 4/2014 | Maki et al. | |
| 9,842,823 B2 | 12/2017 | Yu et al. | |

(Continued)

FOREIGN PATENT DOCUMENTS

| | | |
|---|---|---|
| CN | 102082157 A | 6/2011 |
| JP | 2005322815 A | 11/2005 |

(Continued)

OTHER PUBLICATIONS

Ong, J. J., Chiu, W. L., Lee, O. H., Chiang, C. W., Chang, H. H., Wang, C. H., . . . & Chen, C. (Mar. 2022). Low-Temperature Cu/SiO2 Hybrid Bonding with Low Contact Resistance Using (111)-Oriented Cu Surfaces. Materials, (5), 1888. See highlighted sections.

(Continued)

*Primary Examiner* — Mohammad M Choudhry
(74) *Attorney, Agent, or Firm* — Gavin Giraud

(57) ABSTRACT

An apparatus for bonding a first substrate to a second substrate includes a heatable mounting stage configured to accommodate a first semiconductor substrate on an upward-facing surface and a first stack of semiconductor materials on the first semiconductor substrate; a heatable bond head configured to accommodate a second semiconductor substrate on a downward-facing surface and a second stack of semiconductor materials on the second semiconductor substrate; and a collet disposed on the downward-facing surface of the heatable bond head and configured to receive the second semiconductor substrate and the second stack of semiconductor materials. The heatable bond head is configured to have a vacuum applied thereto to deformably accommodate the second semiconductor substrate and the second stack of semiconductor materials against the collet. The heatable bond head is configured to be pressed against the heatable mounting stage to bond the semiconductor materials.

5 Claims, 5 Drawing Sheets

(52) U.S. Cl.
CPC ............... *H01L 2224/80011* (2013.01); *H01L 2224/80013* (2013.01); *H01L 2224/80019* (2013.01); *H01L 2224/80201* (2013.01); *H01L 2224/80895* (2013.01); *H01L 2224/80896* (2013.01); *H01L 2224/80948* (2013.01)

(58) Field of Classification Search
CPC . H01L 2224/80019; H01L 2224/80201; H01L 2224/80895; H01L 2224/80896; H01L 2224/80948
See application file for complete search history.

(56) References Cited

U.S. PATENT DOCUMENTS

| | | |
|---|---|---|
| 10,923,452 B2 | 2/2021 | Han et al. |
| 11,059,280 B2 | 7/2021 | Wagenleitner et al. |
| 2014/0120654 A1 | 5/2014 | Fujii |
| 2015/0249027 A1* | 9/2015 | Wasserman ....... H01L 21/67092 438/106 |
| 2017/0221856 A1 | 8/2017 | Yamauchi |
| 2019/0304852 A1* | 10/2019 | Seyama ............... H01L 21/6835 |
| 2024/0055389 A1* | 2/2024 | Chang ..................... H01L 24/80 |

FOREIGN PATENT DOCUMENTS

| | | |
|---|---|---|
| JP | 2018125325 A | 8/2018 |
| JP | 2021048201 A | 3/2021 |
| KR | 20180001890 A | 1/2018 |
| WO | 2017155002 A1 | 9/2017 |
| WO | 2024/139188 A1 | 7/2024 |

OTHER PUBLICATIONS

L.T. Zhuravlev: Colloids and Surfaces A: "The Surface Chemistry of Amorphous Silica" Physicochemical and Engineering Aspects 173 (2000) 1-38.

Son, S., Min, J., Jung, E., Kim, H., Kim, T., Jeon, H., . . . & Yeom, G. Y. (Jun. 2020). Characteristics of Plasma-Activated Dielectric Film Surfaces for Direct Wafer Bonding. In 2020 IEEE 70th Electronic Components and Technology Conference (ECTC) (pp. 2025-2032). IEEE. See highlighted sections.

* cited by examiner

STRUCTURES AND PROCESSES FOR VOID-FREE HYBRID BONDING

BACKGROUND

The exemplary embodiments described herein relate generally to apparatuses and methods for substrate bonding and, more specifically, to apparatuses and methods for improving the (yield and) reliability of copper/dielectric hybrid bonding in semiconductor devices.

Miniaturization of microelectronics and associated systems they apply to semiconductor devices involves the increase in densities of functional units (such as microcontrollers, memory components, sensors, and the like) on a chip (system on chip, SOC). Although techniques for increasing density in lateral directions have improved due to advances in the resolution abilities associated with lithography, physical and technological limitations have been met to the point that further increases in density and decreases in spacing are difficult, if not impossible, to achieve. In an effort to improve upon these limitations, 2.5D and 3D technologies have been developed in which the functional units (each with its optimized yield and process) are aligned to the same or even different types of other functional units in stacked arrangements and joined such that vertical networks are formed. As systems and devices are made smaller, the spacing between functional units is also reduced, which presents challenges with regard to integrating functional units using 3D integration.

In manufacturing a semiconductor device, a process of interfacially bonding two or more substrates with each other may be carried out. This substrate bonding process may be performed to improve the density of the functional units in the semiconductor device. For example, a semiconductor device having a structure in which modules are stacked may be advantageous in reduction of a wiring length between the modules and may provide high-speed signal processing together with the improvement of the density.

During the manufacture of a stacked semiconductor device, productivity may be increased in the process of bonding the stacks in wafer form and then dicing (cutting) the stacked semiconductor structure into chip (die) form. The substrate bonding process may be performed using a wafer-to-wafer scheme that involves directly bonding two wafers with appropriate interconnect medium therebetween. The wafer-to-wafer scheme may be performed using a bonding apparatus including a bonding chuck supporting a wafer and a component pressing the wafer. While wafer-to-wafer stack is an efficient method, not all devices can be stacked in wafer form due to die (chip) sizes and the large wafer size format. In addition, wafer stacking lacks known-good-die (KGD) capability. Only high yielding, simple structured devices, such as image sensors, utilize wafer level bonding.

Therefore, it is more preferable to dice the wafers into dies (chips) first and then stack them in the die format (die-to-die connection (D2D)). Or, similarly, to stack dies onto a wafer (die-to-wafer, D2W). This is the preferred method for 3D stacking as each functional units can be optimized separately, especially when a known-good-die (KGD) can be selected prior to the stacking.

The traditional art of die-stacking is through solder bumping (C4, controlled collapsing chip connection). C4 connection has been used in chip-to-laminate (board) connections where typical solder-to-solder distance is about 100 micrometers (um), due largely to the coefficient of thermal expansion (CTE) differences between chip and organic laminate. This solder IO pitch can be reduced to 30 um or less when applied to 3DI (where there is Si-to-Si stack, no CTE difference).

More recently, a solder-less IO joining method is developed, where only Cu IO pads in dielectric surface matrix is used for bonding. This is called Cu/dielectric hybrid bonding, where the bonding occurs at the surface monolayer, as opposed to solder connection through solder melting, requiring microns of solder joining height.

There are several major advantages of Cu/dielectric hybrid bonding compared with solder bonding. Cu/dielectric hybrid bonding is compatible with Si back-end-of-line (BEOL) processing, and the bonded interface can withstand higher post-bonding temperature (400 C) and is BEOL compatible. Solder joining is part of packaging process, not part of silicon process. Solder bonding has the post-bonding temperature typically 250 degrees C. or less. Cu/dielectric bonding is through non-melting Cu diffusion bonding, which allows Cu/dielectric bonding to have much finer IO pitch (center-to-center distance between the IO pads), typically less than 10 um. While solder joining requires solder melt, typically it works at 30 um or more IO pitch.

Unlike solder bonding through melting, Cu/Dielectric bonding goes through two-stages of bonding during bonding. Prior to bonding, the surface must be activated with surface silanols, which is the active molecule for the bonding (silanol acts like molecular glue). The first stage is at (or about) room temperature. At this first stage the dielectrics (via surface silanols) attract to each other through hydrogen bonding. The Cu pads are required to have some recess from the dielectric surface by several nanometers as not to impact this dielectric bonding. Since the dielectric bonding is through surface silanol, a surface flat with less than about 0.3 nanometers (nm) roughness is required.

The second stage of the hybrid bonding is annealing, typically at 200-400 degrees C. for at least 1 hour. At this temperature the surface silanols (in hydrogen bonds) are converted to oxide bonding by releasing water molecules. In addition, at high temperature the Cu pads expand by several nanometers, making contact with each other, and form bonds through solid state diffusion between the Cu pads.

In the bonding processes, metal (such as copper) may be bonded to metal, metal may be bonded to dielectric material, and dielectric material may be bonded to other dielectric material. Voids formed between the bonded materials, however, typically lead to inconsistencies and defects in the finished semiconductor device.

The formation of such voids generally arises from the presence of moisture between bonding surfaces, particularly when the bonding process involves oxides. There are several sources of moisture identified in prior and current experiments.

One of such sources is the oxide bonding itself. The oxide bonding is a silanol-silanol condensation reaction in which water is generated as the leaving group when the oxide bond forms:

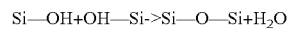

$$Si-OH + OH-Si \rightarrow Si-O-Si + H_2O$$

the water then forms voids during the dielectric-to-dielectric bond if the moisture cannot leave the bonding surface properly.

In a further example, moisture condensation on silica surfaces can be said to be the source of voids. Unlike moisture dew (volume) which condenses around freezing temperature (0 degrees C.), surface moisture condenses at much higher temperature, around 25 degrees C.). Based on research by Zhuravlev, models have been constructed using analyses of the processes of dehydration (the removal of physically adsorbed water), dehydroxylation (the removal of silanol groups from the silica surface), and rehydroxylation (the restoration of the hydroxyl covering) to describe the surface chemistry of amorphous silica. Using these models, wafer molecules both multi-layer adsorption at 25 degrees C. and below as well as adsorption in a single layer at about 100 degrees C. have been found to be the sources of void formation. This has been confirmed by the nuclear magnetic resonance study of water on silica.

Since oxide-bonding occurs at the surface monolayer level, these sources of moisture can easily interfere and overwhelm the proper formation of oxide bond at different stages of bonding, resulting in varying bonding voids.

With regard to dielectric-to-dielectric bonding, experiments have shown that defects such as large voids are developed when a die is thick (rigid) and at about 20 degrees C. (room temperature). Tilting a thicker die produced a reduced amount of large voids, but the resulting die had edge damage. Such voids are largely due to surface moisture unable to move quickly out of the way from the formation of the bonding surface.

Also bulk oxides (such as tetraethyl orthosilicate (TEOS) and low-temperature-oxide (LTO)) have been determined as having internal (bulk) moisture, as evidenced by IR spectroscopy. This bulk moisture is reversible between Si—OH and Si—O—Si under heating. This Si—O—Si to Si—OH reversal permits large amounts of moisture release at high temperature (greater than 450 degrees C.), leading to blown-out defects, even for the initial void-free TEOS bonds (at 300 degrees C.). These voids are due to moisture trapped inside oxide bulk and outgassing at higher temperature (450 degrees C.).

BRIEF SUMMARY

In one exemplary aspect, an apparatus for bonding a first substrate to a second substrate comprises a heatable mounting stage configured to accommodate a first semiconductor substrate on an upward-facing surface and a first stack of semiconductor materials on the first semiconductor substrate; a heatable bond head configured to accommodate a second semiconductor substrate on a downward-facing surface and a second stack of semiconductor materials on the second semiconductor substrate; and a collet disposed on the downward-facing surface of the heatable bond head and configured to receive the second semiconductor substrate and the second stack of semiconductor materials. The heatable bond head is configured to have a vacuum applied thereto to deformably accommodate the second semiconductor substrate and the second stack of semiconductor materials against the collet. The heatable bond head is configured to be pressed against the heatable mounting stage to bond the second stack of semiconductor materials to the first stack of semiconductor materials. The heatable bond stage is configured to have a vacuum applied thereto to flatten and secure the first semiconductor substrate during bonding.

In another exemplary aspect, a method comprises providing a bond head and a stage; providing an upper substrate comprising a silicon die device having first layer of tetraethyl orthosilicate on the silicon die device and a first layer of silicon carbon nitride on the first layer of tetraethyl orthosilicate; positioning the upper substrate under a collet extending from a downward-facing surface of the bond head; vacuuming the upper substrate to the downward-facing surface of the bond head over the collet such that the upper substrate is deformed to have a downward-facing convex surface; vacuuming a bottom substrate to the stage; providing a second layer of tetraethyl orthosilicate on an upward facing surface of the bottom substrate and a second layer of silicon carbon nitride on the second layer of tetraethyl orthosilicate; isothermally heating at least one of the bond head or the stage to control a thermal distortion between the silicon die device on the upper substrate and the bottom substrate; pressing the bond head against the stage to bond the first layer of silicon carbon nitride to the second layer of silicon carbon nitride; releasing the vacuum; and retracting the bond head from the stage.

In another exemplary aspect, a method of forming a semiconductor structure comprises fabricating a top wafer, the top wafer comprising a silicon substrate, a first layer of tetraethyl orthosilicate, and a first layer of silicon carbon nitride; applying a surface protection coating to the top wafer; thinning the top wafer; attaching the top wafer on a dicing tape and dicing the top wafer; stripping the surface protection coating; picking a top die containing a portion of the top wafer from the dicing tape; applying a vacuum to the picked top die over a collet on a bond head such that the picked top die has an outer convex surface; applying a vacuum to a bottom wafer with a second layer of tetraethyl orthosilicate and a second layer of silicon carbon nitride to a stage; isothermally heating at least one of the bond head or the stage; and bonding the picked top die to the bottom wafer with the second layer of tetraethyl orthosilicate and the second layer of silicon carbon nitride on the stage.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The words "exemplary" and example are used herein to mean "serving as an example, instance, or illustration." Any embodiment described herein as "exemplary" or "example" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments described herein are directed to apparatuses and methods for the improvement of copper/dielectric bonding in semiconductor devices. The improvement of such bonding enables high density input/output (IO) connections to be made on a chip structure while allowing for reduced back-end-of-line (BEOL) processing and improved 3D integration (3Di) stacking of functional units in the structure. The high density IO connection of the copper/dielectric hybrid bond refers to Cu bonding pads of a size of about 1 um, with 10 um as the distance between the pads. In the examples disclosed herein, for solder bonding the bonding pad may be about 10 um with distance between the pads being about 20 um. The 1 um dimension may also mean the distance between the pads in advanced hybrid bonding. In this case, the pad size may be about 0.5 um in diameter. In either case, the hybrid bonding to IO density is much higher per unit area than solder connection would be.

Figure 1A:
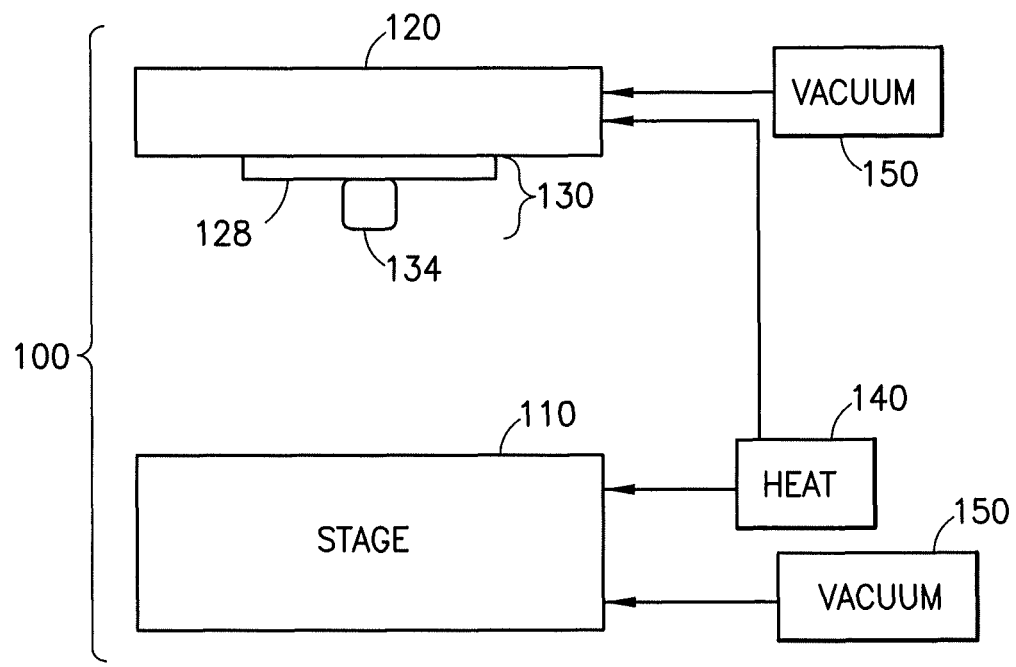
FIG. 1A is a schematic diagram of a bonding apparatus having an example collet.

In FIG. 1A, one example apparatus for the improvement of hybrid bonding in semiconductor structures is shown generally at 100 and is hereinafter referred to as "bonding apparatus 100." Bonding apparatus 100 includes a stage 110, a bond head 120, and a collet 130 attached to the bond head 120, all of which cooperate to form a wafer product or hybrid semiconductor structure comprising copper and a dielectric material that may ultimately result in a semiconductor device. The collet 130 comprises a plate 128 mounted to the bond head 120 on an upward-facing side of the plate 128 and a protrusion 134 that extends about 10 micrometers (um) to about 20 um from a downward-facing surface of the plate 128. The plate may cover only a portion of the bond head 120.

Also in FIG. 1A, the stage 110 is configured to be able to have a stack of semiconductor materials mounted on an upper bond head-facing surface. Both the stage 110 and the bond head 120 are configured to be heated in a controlled manner to about 40 degrees C. to about 60 degrees C. using a heater 140. However, it is possible to heat only the bond head 120 or the stage 110. Furthermore, for die-to die (D2D) and die-to-wafer (D2W) hybrid bonding, due to the smaller bonding footprints, there may be an operational advantage to using differential temperatures between the bond head 120 and the stage 110. It may also be preferable to use isothermal heating (same temperature between the bond head 120 and the stage 110) when a tighter alignment accuracy (for example, less than 0.1 um) is desired. Such flexibility may not be available for wafer-to-wafer bonding.

The bond head 120 is also configured to have a vacuum 150 applied thereto to allow a top die to be held to a lower stage-facing surface of the bond head 120 or to secure the bottom wafer/die (bottom wafer or bottom die) during the bonding process and also to flatten the wafer/die. Vacuum may also be applied to the stage 110. Either wafer/die may be held in place by electrostatic forces in addition to or without vacuum. Any suitable pressure mechanism 160 may be used to press the bond head 120 against the stage 110.

Figure 1B:
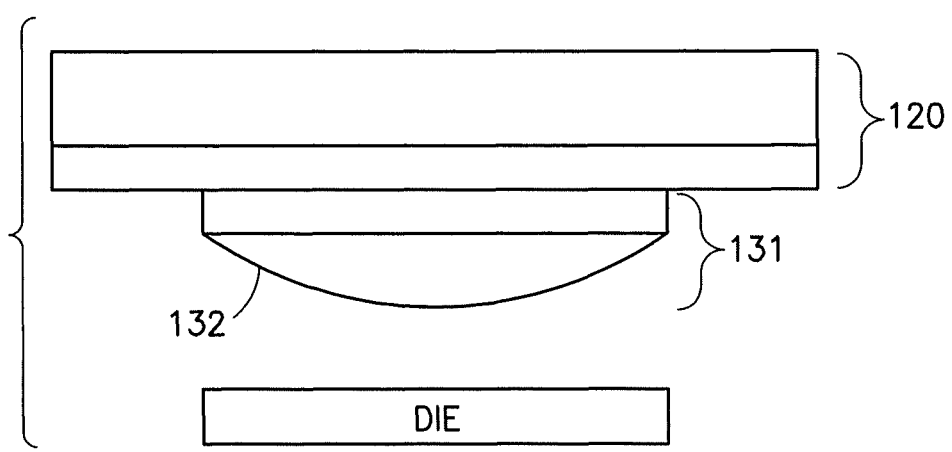
FIG. 1B is a schematic diagram of an alternate example collet for the bonding apparatus.

As shown in FIG. 1B, another example collet 131 attachable to the bond head 120 may comprise a rounded or otherwise curved surface 132. In any embodiment, the size and shape of the collet depends upon the sizes and thicknesses of the target dies.

Figure 2:
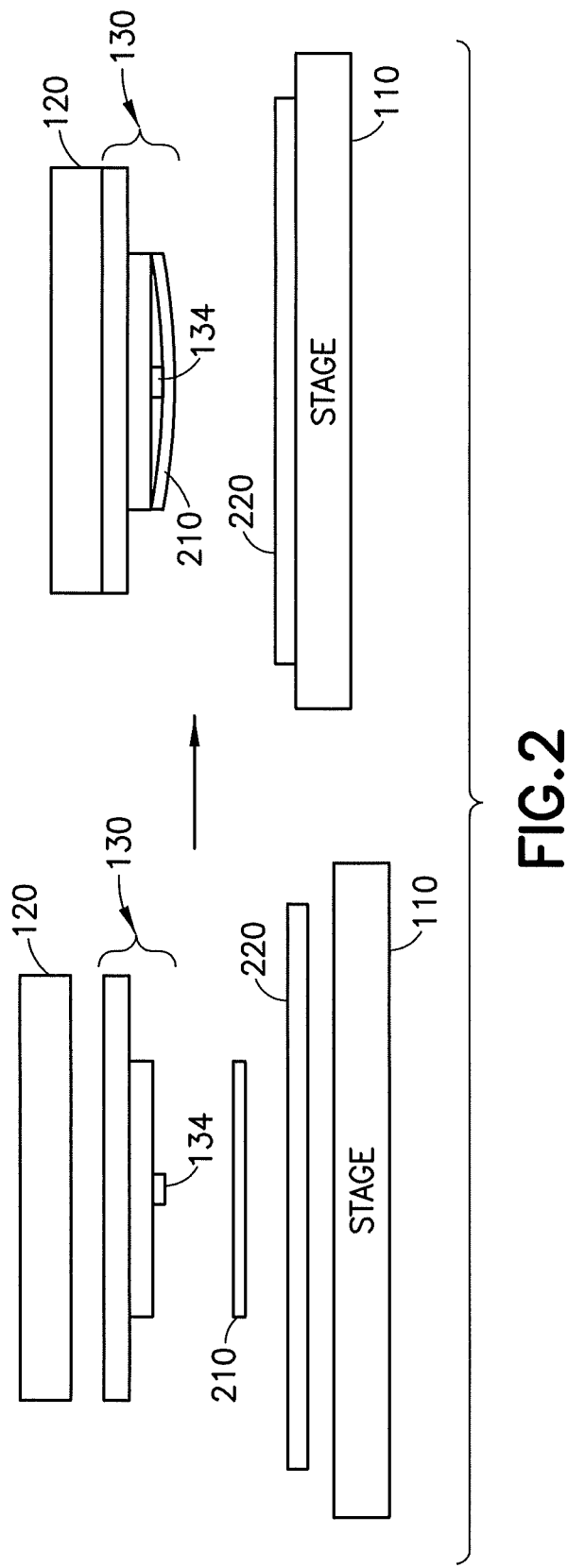
FIG. 2 is a schematic diagram of one example embodiment of the bonding apparatus of FIG. 1A with one example embodiment of a semiconductor structure fabricated with the bonding apparatus.

Referring now to FIG. 2, the semiconductor structure (shown at 200) may be formed with the bonding apparatus 100 using a Si chip as a top die 210 (or in a wafer-to-wafer process), a first layer of TEOS (or other type of oxide dielectric (bulk)), and a first layer of bonding interface material SiCN (or SiON, Sio, etc.) covering the TEOS (without SiCN, TEOS could take up bulk moisture through the reverse of the oxide bonding as described above):

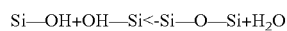

Si—OH+OH—Si<-Si—O—Si+H$_2$O

SiCN is a highly hydrophobic material, is an effective moisture barrier, and forms a hermetic seal on top of TEOS. Without SiCN, moisture can freely move in and out of TEOS. With SiCN, all moisture (in the bulk and on the surface) can no longer affect the bonding surface, making the structure much more stable at higher temperature. The TEOS/SiCN is with Cu vias to form hybrid bonding, with the Cu via size being 0.1 um to 3 um, and the distance between the vias being two to ten times the via size.

As shown, the semiconductor structure 200 may be formed by bonding an upper layer to a lower layer using the bonding apparatus 100. The upper layer comprises the silicon device as the top die 210, the first layer of TEOS, and the first layer of SiCN as a first stack. The lower die comprises a second silicon device or wafer 220 with a second layer of TEOS and a second layer of SiCN as a second stack. The top die 210 may be a silicon substrate having a thickness of or being thinned to about 30 to 200 um. A thickness of this magnitude allows the top die 210 to be vacuumed to the bond head 120 over the collet 130 such that the upper layer can be deflected by the protruding collet 130 about 10 um to about 20 um to allow the upper layer to maintain a convex shape on the side opposite the collet 130. The convex shape of the upper layer allows moisture to be dispelled, instead of being trapped, as would be the case in a thicker die not bent into a convex shape.

The temperatures of both the bond head 120 and the stage 110 are raised to about 40 degrees C. to about 60 degrees C. Doing so allows the bond head 120 and the stage 110 to be maintained at the same temperature in order to reduce thermal mismatch between the molecular structures of the materials, particularly with regard to fine pitch IO, and to remove adsorbed surface moisture. As shown in the Zhuravlev model, at 25 degree C. and below (slightly above room temperature), moisture condenses into multi-layer adsorbates on the bonding surface. Bonding without driving out such moisture would leave "small voids" typically less than 50 um in size and as small as 0.5 um at the interface. Raising the bonding temperature 40 degrees C. to 60 degrees C. can reduce the amount of surface moisture to less than one monolayer and push the moisture out of interface along the convex surface. Silanol is stable to 190 degrees C., but moisture trapped between and on the silanol is completely desorbed at 120 degrees C. "Tiny" voids can be removed due to the multi-layered moisture absorption at 25 degrees C. and below. As an example, large voids (by flat surface trapping) are removed by the convex surface, and "small voids" (condensed moisture) are removed by raised bonding temperatures. Bulk moisture (blown-out) is removed by SiCN hermetic seal.)

The first layer of TEOS (which can be a BEOL structure in general), the first layer of SiCN, the second layer of TEOS (or BEOL in general), and the second layer of SiCN are used for the bonding surfaces. The SiCN in each stack is a layer about 1000 angstroms (A) in thickness, and the TEOS in each stack is a layer about 1 um in thickness. SiCN is a better stop layer in a chemical-mechanical polish (CMP) operation than oxide and has a thin bondable surface native oxide (about 1 nanometer (nm). SiCN—SiCN bonding is through this surface native oxide. The SiCN also has a more consistent bonding energy than oxide. The bulk of the oxide (TEOS) has about 25% moisture, which can diffuse toward the bonding surface and lead to pop-up defects at high temperatures (about 450 degrees C.). The SiCN is impermeable to moisture, and so it therefore prevents the moisture in the TEOS from being diffused to the bonding interface, thereby preventing pop-up defects.

In operation of the bonding apparatus 100 to form the semiconductor structure 200, the bond head 120 with the upper layer vacuumed thereto is pressed onto the lower layer on the stage 110. The bonding force is about 0.1 gram (g) to about 1000 g. The bonding dwell time is about 0.1 second (s) to about 5 s. After the desired dwell time, the vacuum is released and the bond head 120 is retracted. This low-temperature bonding is a weak bonding mainly due to Van der Waals forces between the —OH of the upper substrate and the —OH of the lower substrate. After this, bonding utilizes high temperature annealing for Cu and Cu diffusion and to make the oxide bonding strongly covalent. This annealing process takes about 1 to 4 hours at 200 to 400 degrees C. However, experiments have revealed that annealing at higher temperatures causes large (blown-out) voids at the bonding interface, if only TEOS is used. With SiCN/TEOS double layer, such high temperature blown-out can be prevented. The source of blown-out voids is attributed to the bulk moisture absorption in TEOS. With SICN on TEOS such absorption outgassing can be eliminated.

Figure 3:
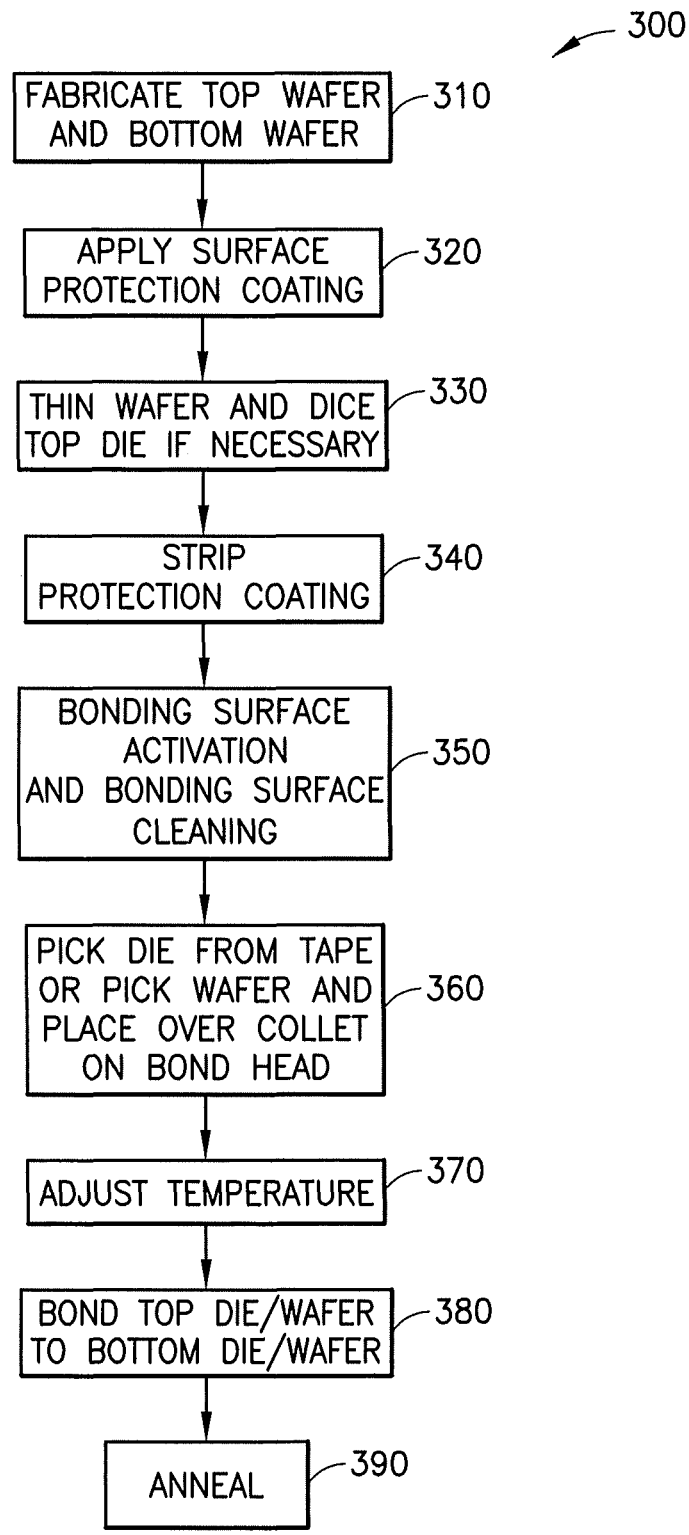
FIG. 3. is a flow of a method of one example process of fabricating a semiconductor structure.

Referring now to FIG. 3, a flow of one example method of forming the semiconductor structure 200 is shown generally at 300 and is hereinafter referred to as "method 300." In method 300, the top wafer and the bottom wafer are fabricated, as indicated at step 310. The Cu pad and dielectric films (TEOS, SiCN, SiON, etc.) used for hybrid bonding are formed at this step 310. At step 320 a surface protection coating is applied to the top wafer, and at step 330 the top wafer is thinned if necessary (for example, using a grinding tool and CMP). The wafer is placed on a dicing tape and diced in the case of die-level hybrid bonding. In the case of wafer level hybrid bonding, it is not necessary to attach to the dicing tape. At step 340, the surface protection coating is stripped after dicing and before the bonding process. At step 350, an activation and cleaning step is carried out. Activation means to populate the surface with silanol since silanol acts as the "glue" in oxide bonding. The cleaning removes all other debris leaving only the silanol of the surface. At step 360, in the case of die-level hybrid bonding, one die of the top wafer is picked from the dice tape and vacuumed over the collet on the bond head to form a convex surface that extends about 10 um to about 20 um from the surface of the bond head. In the case of wafer level hybrid bonding, the wafer is attached to the bonding collet as it is. At step 370, the temperatures of both the bond head and the stage are adjusted to 40 degrees C. (or more). At step 380, the top die wafer is bonded to the bottom wafer (or die) in the case of die-level hybrid bonding. At step 390, high temperature annealing may be conducted for Cu and Cu diffusion and to make the oxide bonding strong with covalent bonding. This annealing process takes about 1 to 4 hours at 200 to 400 degrees C. The bottom die 110 is substrate-like and part of the bonding pair that is generally larger, heavier, sturdier, and thicker so as to function as a supporting structure.

Figure 4:
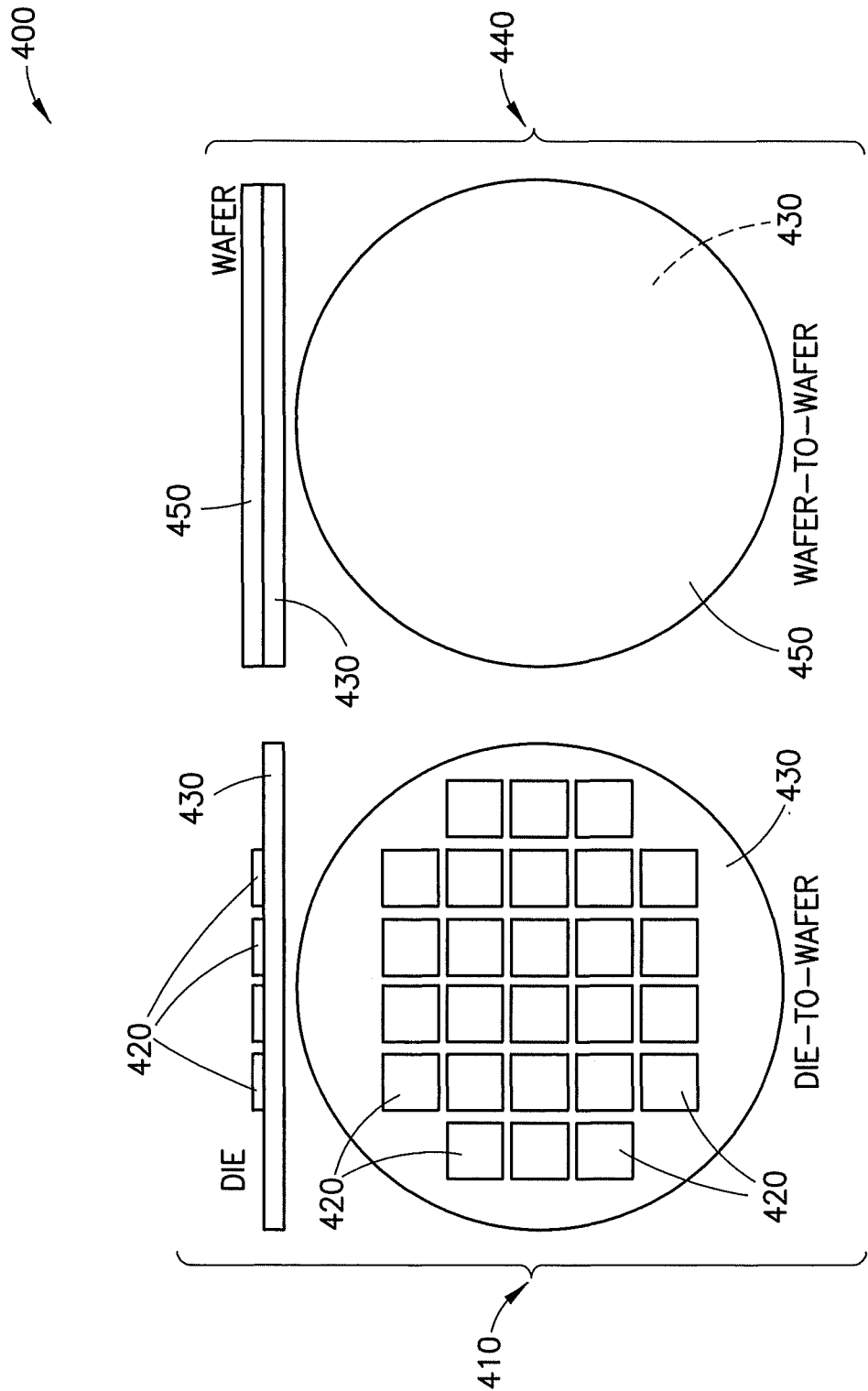
FIG. 4 is a schematic representation of a comparison of die-to-wafer bonding and wafer-to-wafer bonding.

As shown in FIG. 4, a comparison of die-to-wafer and wafer-to-wafer bonding is shown generally at 400. As shown at 410, a plurality of dies 420 is bonded to an underlying wafer 430. As shown at 440, a single upper wafer 450 is bonded to the underlying wafer 430.

Figure 5:
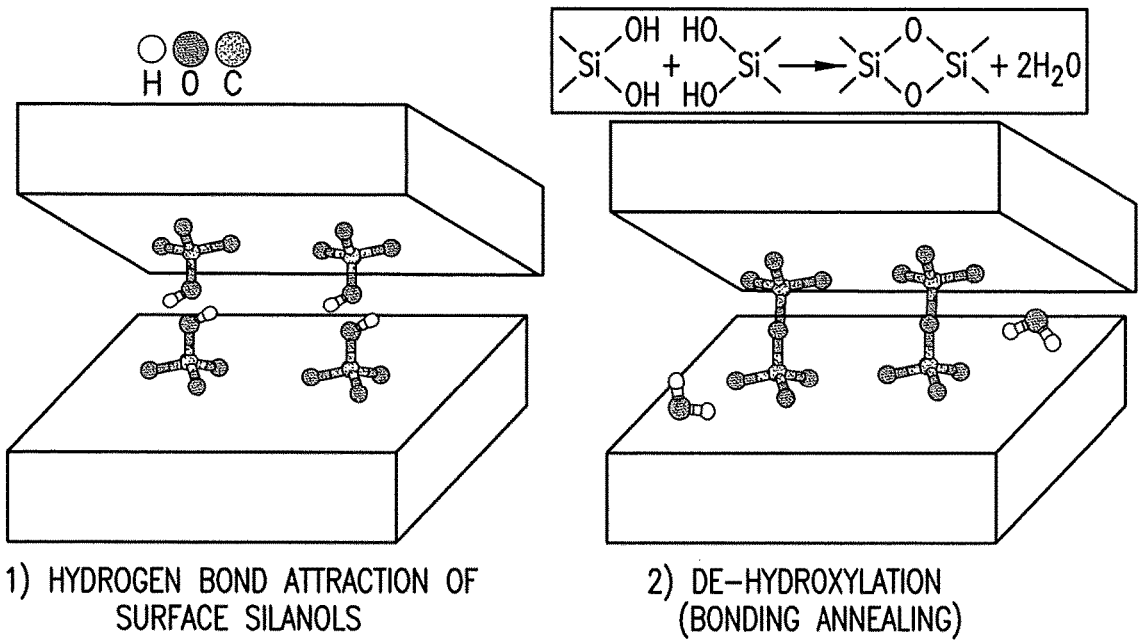
FIG. 5 is a schematic representation of silanol bonding.
Figure 5:
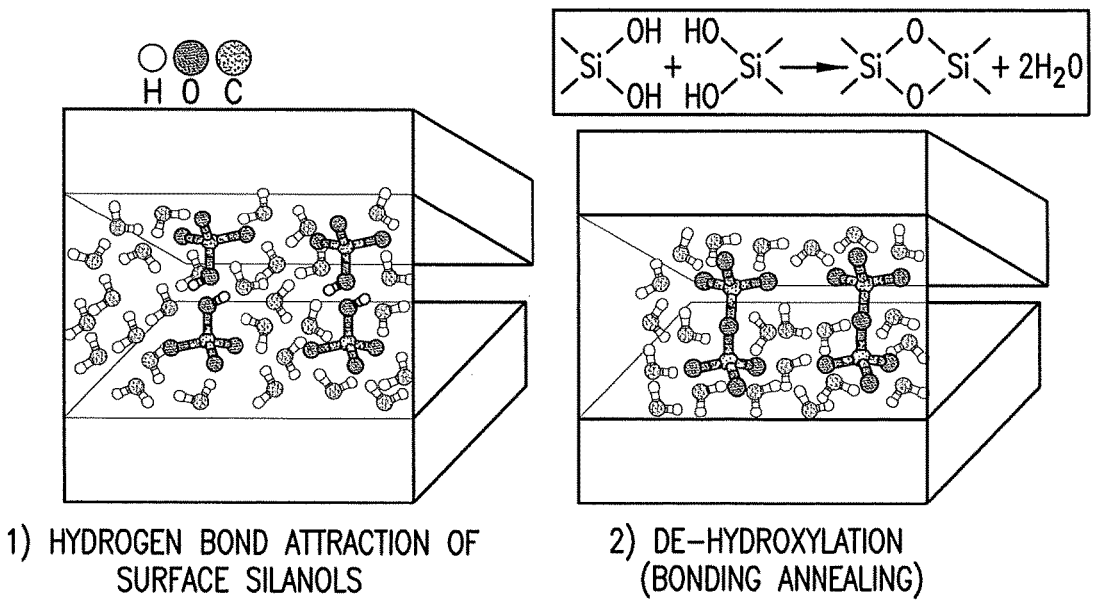

Referring now to FIG. 5, an illustration 500 showing an ideal silanol bonding is compared to an illustration showing actual silanol bonding (with moisture). The comparison is based on the Zhuravlev model. The top panel shows the "ideal" bonding surface. The bottom panel shows the "actual" bonding surface, dominated by moisture.

Some example embodiments of the apparatuses and methods disclosed herein provide several significant high value attributes. First, hybrid bonding is a new direction in 3Di stacking, thereby allowing for significant IO pitch reduction (about 1 um (this is for IO pitch, which is the distance between IO centers)) as compared to solder microbump technology (about 5 um, also IO center-center) previously used. Second, because moisture plays a role in the bonding processes, it also forms voids at the interface of the bulk and bonding materials, thus leading to defects in the finished product. This is an industry-wide issue that the apparatuses and methods disclosed herein address. The example methods as disclosed herein resolve the issue of voids at the interface and improve the technology pertaining to three dimensional stacking of functional units.

In one aspect, an apparatus for bonding a first substrate to a second substrate comprises a heatable mounting stage configured to accommodate a first semiconductor substrate on an upward-facing surface and a first stack of semiconductor materials on the first semiconductor substrate; a heatable bond head configured to accommodate a second semiconductor substrate on a downward-facing surface and a second stack of semiconductor materials on the second semiconductor substrate; and a collet disposed on the downward-facing surface of the heatable bond head and configured to receive the second semiconductor substrate and the second stack of semiconductor materials. The heatable bond head is configured to have a vacuum applied thereto to deformably accommodate the second semiconductor substrate and the second stack of semiconductor materials against the collet. The heatable bond head is configured to be pressed against the heatable mounting stage to bond the second stack of semiconductor materials to the first stack of semiconductor materials. The heatable bond stage is configured to have a vacuum applied thereto to flatten and secure the first semiconductor substrate during bonding.

The collet may be mounted in a center portion of the downward-facing surface of the heatable bond head and may extend 5 micrometers to 50 micrometers from the downward-facing surface. At least one of the heatable mounting stage and the heatable bond head may be configured to be heated to 25 degrees C. to 100 degrees C. A pressure applied by the heatable bond head against the heatable mounting stage may be 0.1 grams to 1000 grams. A downward facing surface of the collet may be curved.

In another aspect, a method comprises providing a bond head and a stage; providing an upper substrate comprising a silicon die device having first layer of tetraethyl orthosilicate on the silicon die device and a first layer of silicon carbon nitride on the first layer of tetraethyl orthosilicate; positioning the upper substrate under a collet extending from a downward-facing surface of the bond head; vacuuming the upper substrate to the downward-facing surface of the bond head over the collet such that the upper substrate is deformed to have a downward-facing convex surface; vacuuming a bottom substrate to the stage; providing a second layer of tetraethyl orthosilicate on an upward facing surface of the bottom substrate and a second layer of silicon carbon nitride on the second layer of tetraethyl orthosilicate; isothermally heating at least one of the bond head or the stage to control a thermal distortion between the silicon die device on the upper substrate and the bottom substrate; pressing the bond head against the stage to bond the first layer of silicon carbon nitride to the second layer of silicon carbon nitride; releasing the vacuum; and retracting the bond head from the stage.

The method may further comprise thinning the silicon die device to 30 to 200 micrometers. Vacuuming the upper substrate to the downward-facing surface of the bond head over the collet such that the upper substrate is deformed to have a downward-facing convex surface may allow moisture to be dispelled from the upper substrate and from the first layer of tetraethyl orthosilicate through the first layer of silicon carbon nitride. Isothermally heating at least one of the bond head or the stage may comprise heating to 40 degrees C. to 60 degrees C. The first layer of tetraethyl orthosilicate and the second layer of tetraethyl orthosilicate may be each about 0.5 micrometers to about 5 micrometers in thickness. The first layer of silicon carbon nitride and the second layer of silicon carbon nitride may be each about 0.05 micrometers to about 0.2 micrometers in thickness. The method may further comprise annealing the bonded materials at a temperature of 200 degrees C. to 400 degrees C. at a time of 1 hours to 4 hours. Pressing the bond head against the stage may comprise pressing the bond head at a pressure of 0.1 grams to 1000 grams.

In another aspect, a method of forming a semiconductor structure comprises fabricating a top wafer, the top wafer comprising a silicon substrate, a first layer of tetraethyl orthosilicate, and a first layer of silicon carbon nitride; applying a surface protection coating to the top wafer; thinning the top wafer; attaching the top wafer on a dicing tape and dicing the top wafer; stripping the surface protection coating; picking a top die containing a portion of the top wafer from the dicing tape; applying a vacuum to the picked top die over a collet on a bond head such that the picked top die has an outer convex surface; applying a vacuum to a bottom wafer with a second layer of tetraethyl orthosilicate and a second layer of silicon carbon nitride to a stage; isothermally heating at least one of the bond head or the stage; and bonding the picked top die to the bottom wafer with the second layer of tetraethyl orthosilicate and the second layer of silicon carbon nitride on the stage.

The method may further comprise activating bonding surfaces by using a plasma treatment and a deionized water cleaning after stripping the surface protection coating and before picking the top die from the dice tape. Isothermally heating at least one of the bond head or the stage may comprise heating to 40 degrees C. to 60 degrees C. Bonding the picked top die to the bottom wafer with the second layer of tetraethyl orthosilicate and the second layer of silicon carbon nitride on the stage may comprise pressing the bond head to the stage at a pressure of 0.1 grams to 1000 grams. The method may further comprise releasing the applied vacuum. The method may further comprise retracting the bond head from the stage. The method may further comprise annealing the bonded top die and the bottom wafer.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. An apparatus for bonding a first substrate to a second substrate, the apparatus comprising:
   a heatable mounting stage configured to accommodate a first semiconductor substrate on an upward-facing surface and a first stack of semiconductor materials on the first semiconductor substrate;
   a heatable bond head configured to accommodate a second semiconductor substrate on a downward-facing surface and a second stack of semiconductor materials on the second semiconductor substrate; and
   a collet disposed on the downward-facing surface of the heatable bond head and configured to receive the second semiconductor substrate and the second stack of semiconductor materials;
   wherein the heatable bond head is configured to have a vacuum applied thereto to deformably accommodate the second semiconductor substrate and the second stack of semiconductor materials against the collet;
   wherein the heatable bond head is configured to be pressed against the heatable mounting stage to bond the second stack of semiconductor materials to the first stack of semiconductor materials; and
   wherein the heatable bond stage is configured to have a vacuum applied thereto to flatten and secure the first semiconductor substrate during bonding.

2. The apparatus of claim 1, wherein the collet is mounted in a center portion of the downward-facing surface of the heatable bond head and extends 5 micrometers to 50 micrometers from the downward-facing surface.

3. The apparatus of claim 1, wherein at least one of the heatable mounting stage and the heatable bond head are configured to be heated to 25 degrees C. to 100 degrees C.

4. The apparatus of claim 1, wherein a pressure applied by the heatable bond head against the heatable mounting stage is 0.1 grams to 1000 grams.

5. The apparatus of claim 1, wherein a downward facing surface of the collet is curved.

* * * * *